US010451815B2

(12) United States Patent
Flaig et al.

(10) Patent No.: US 10,451,815 B2
(45) Date of Patent: Oct. 22, 2019

(54) METHODS FOR PROCESSING FERRULES AND/OR OPTICAL FIBERS

(71) Applicants: COMMSCOPE TECHNOLOGIES LLC, Hickory, NC (US); COMMSCOPE ASIA HOLDINGS B.V., Bussum (NL)

(72) Inventors: Robert Charles Flaig, Lancaster, PA (US); Michael Lawrence Gurreri, York, PA (US); Joshua Lee Webb, Stewartstown, PA (US); Michael Aaron Kadar-Kallen, Harrisburg, PA (US); Randall Bobby Paul, Elizabethville, PA (US); Dwight Andrew Bretz, Hummelstown, PA (US); Paul Schneider, Gemonde (NL); Tom De Boer, Utrecht (NL); Dirk Alexander De Gast, Geldermalsen (NL)

(73) Assignees: CommScope Technologies LLC, Hickory, NC (US); CommScope Asia Holdings B.V., Bussum (NL)

( * ) Notice: Subject to any disclaimer, the term of this patent is extended or adjusted under 35 U.S.C. 154(b) by 0 days.

(21) Appl. No.: 15/777,620

(22) PCT Filed: Nov. 18, 2016

(86) PCT No.: PCT/US2016/062857
§ 371 (c)(1),
(2) Date: May 18, 2018

(87) PCT Pub. No.: WO2017/087849
PCT Pub. Date: May 26, 2017

(65) Prior Publication Data
US 2018/0329156 A1    Nov. 15, 2018

Related U.S. Application Data

(60) Provisional application No. 62/257,041, filed on Nov. 18, 2015.

(51) Int. Cl.
*G02B 6/38* (2006.01)

(52) U.S. Cl.
CPC ......... *G02B 6/3863* (2013.01); *G02B 6/3853* (2013.01); *G02B 6/3861* (2013.01)

(58) Field of Classification Search
CPC .......................... G02B 6/3863; G02B 6/3853
See application file for complete search history.

(56) References Cited

U.S. PATENT DOCUMENTS

| | | |
|---|---|---|
| 4,510,005 A | 4/1985 | Nijman |
| 4,984,865 A | 1/1991 | Lee et al. |

(Continued)

FOREIGN PATENT DOCUMENTS

WO    03/042739 A1    5/2003

OTHER PUBLICATIONS

International Search Report and Written Opinion of the International Searching Authority for corresponding International Patent Application No. PCT/US2016/062857 dated Jan. 20, 2017, 15 pages.

(Continued)

*Primary Examiner* — Sung H Pak
(74) *Attorney, Agent, or Firm* — Merchant & Gould P.C.

(57) ABSTRACT

The present disclosure relates generally to methods for processing ferrules of fiber optic connectors such that the amount of polishing that is required is eliminated or at least reduced. In one example, an energy source is used to remove excess adhesive from the end face of the fiber and likely from an end face of the ferrule.

40 Claims, 13 Drawing Sheets

(56) References Cited

U.S. PATENT DOCUMENTS

| | | | |
|---|---|---|---|
| 5,049,225 | A | 9/1991 | Schlingensiepen et al. |
| 5,421,928 | A | 6/1995 | Knecht et al. |
| 5,464,361 | A | 11/1995 | Suzuki et al. |
| 5,594,825 | A | 1/1997 | Kawasaki et al. |
| 5,883,995 | A | 3/1999 | Lu |
| 5,966,485 | A | 10/1999 | Luther et al. |
| 6,142,676 | A | 11/2000 | Lu |
| 6,361,219 | B1 | 3/2002 | Blyler, Jr. et al. |
| 6,413,450 | B1 | 7/2002 | Mays, Jr. |
| 6,957,920 | B2 | 10/2005 | Luther et al. |
| 7,031,567 | B2 | 4/2006 | Grinderslev et al. |
| 7,155,096 | B2 | 12/2006 | Chanclou et al. |
| 7,216,512 | B2 | 5/2007 | Danley et al. |
| 7,264,403 | B1 | 9/2007 | Danley et al. |
| 8,340,485 | B2 | 12/2012 | Danley et al. |
| 8,696,215 | B1* | 4/2014 | Fewkes ............... G02B 6/3861 385/80 |
| 8,740,474 | B2 | 6/2014 | Lu |
| 8,753,021 | B1 | 6/2014 | Beca et al. |
| 8,985,866 | B2 | 3/2015 | Danley et al. |
| 9,085,047 | B2* | 7/2015 | Danley ................. B23K 26/38 |
| 9,416,046 | B2* | 8/2016 | Carberry ............... C03B 37/16 |
| 2005/0180702 | A1 | 8/2005 | Kevern et al. |
| 2006/0018605 | A1 | 1/2006 | Luther et al. |
| 2006/0137403 | A1* | 6/2006 | Barr ....................... G02B 6/262 65/377 |
| 2008/0210362 | A1 | 9/2008 | Douglass et al. |
| 2010/0027943 | A1 | 2/2010 | Armani et al. |
| 2010/0303416 | A1 | 12/2010 | Danley et al. |
| 2012/0051706 | A1* | 3/2012 | van Geffen .......... G02B 6/3833 385/134 |
| 2012/0145307 | A1 | 6/2012 | Margolin et al. |
| 2012/0263422 | A1 | 10/2012 | Lu |
| 2014/0124140 | A1 | 5/2014 | Verheyden et al. |
| 2014/0157561 | A1 | 6/2014 | van Geffen et al. |
| 2015/0030291 | A1 | 1/2015 | Webb et al. |

OTHER PUBLICATIONS

Ohtsuka, K. et al., "Non-fixed Fiber-Portion-Compressed Type Multi-fiber PC Optical Connector", Sumitomo Electric Industries, Ltd., Communication Cables and Related Technologies, 415-420 (1998).

Extended European Search Report for corresponding European Patent Application No. 16867258.2 dated Jul. 9, 2019, 6 pages.

* cited by examiner

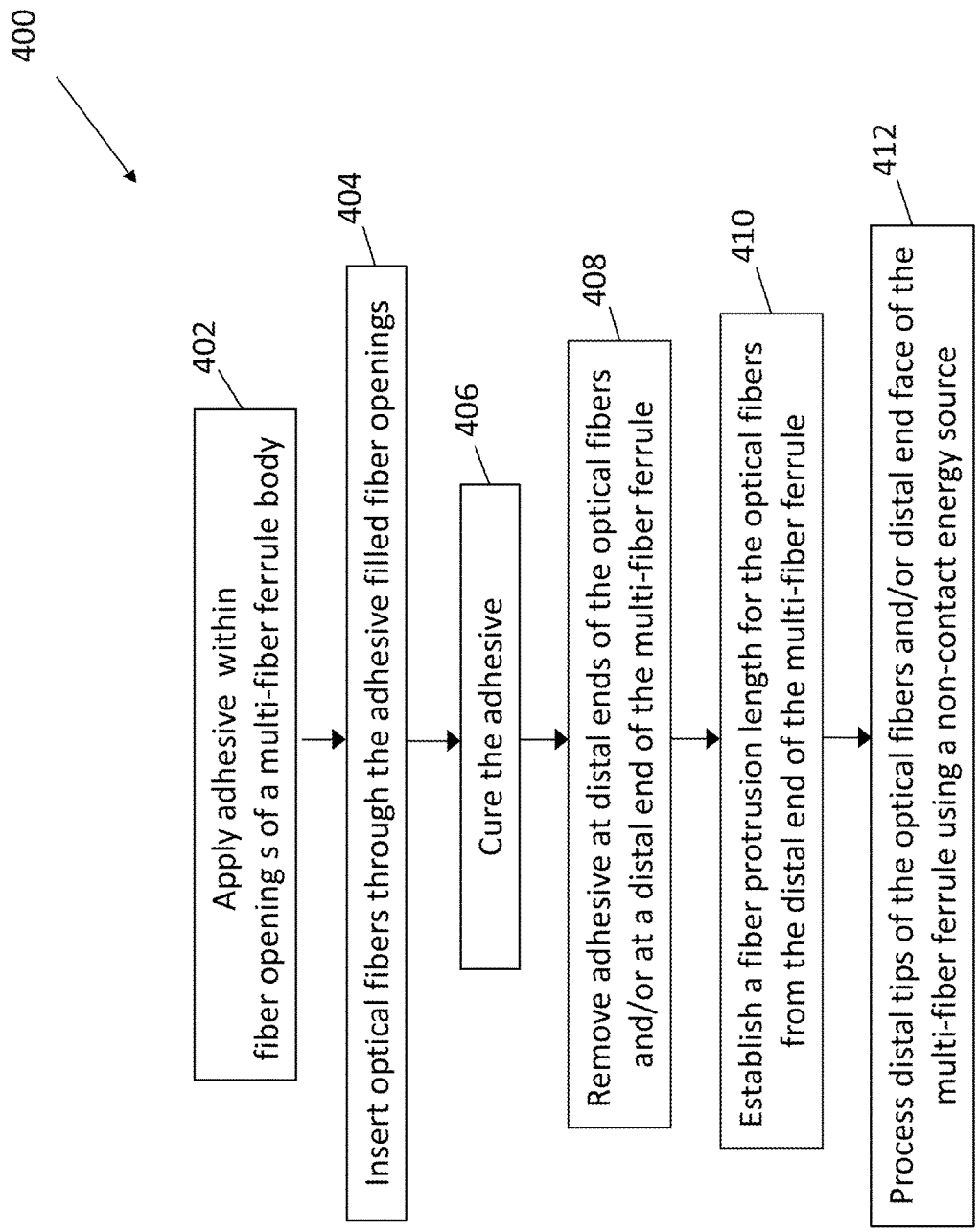

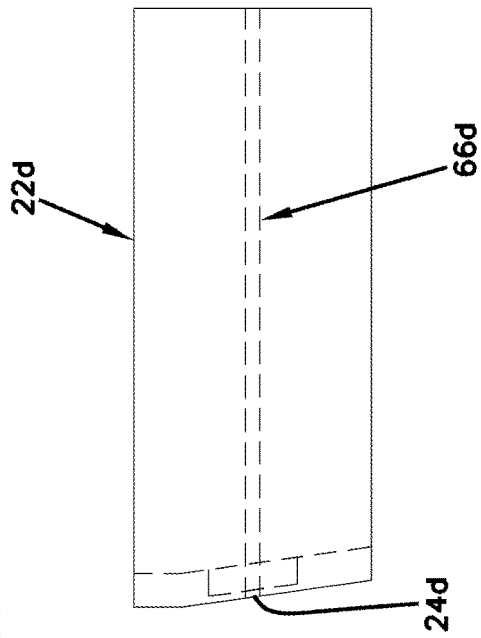
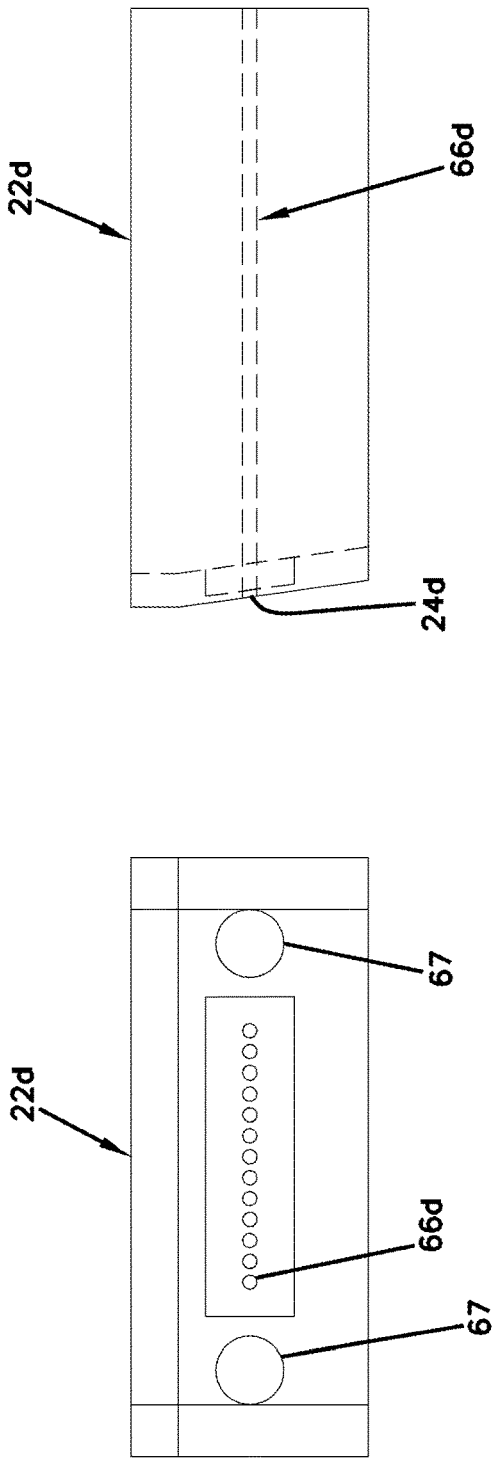
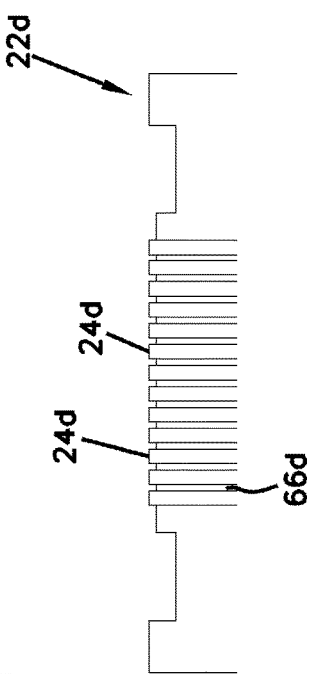

METHODS FOR PROCESSING FERRULES AND/OR OPTICAL FIBERS

CROSS-REFERENCE TO RELATED APPLICATION

This application is a National Stage Application of PCT/US2016/062857, filed on Nov. 18, 2016, which claims the benefit of U.S. Patent Application Ser. No. 62/257,041, filed on Nov. 18, 2015, the disclosures of which is are incorporated herein by reference in their entireties. To the extent appropriate, a claim of priority is made to each of the above disclosed applications.

TECHNICAL FIELD

The present disclosure relates generally to methods for processing components of fiber optic connectors. More particularly, the present disclosure relates to methods for processing ferrules and corresponding optical fibers used in fiber optic connectors.

BACKGROUND

Fiber optic communication systems are becoming prevalent in part because service providers want to deliver high band width communication capabilities (e.g., data and voice) to customers. Fiber optic communication systems employ a network of fiber optic cables to transmit large volumes of data and voice signals over relatively long distances. Fiber optic connectors are an important part of most fiber optic communication systems. Fiber optic connectors allow optical fibers to be quickly optically connected without requiring a splice. Fiber optic connectors can include single fiber connectors and multi-fiber connectors.

A typical fiber optic connector includes a ferrule assembly supported at a distal end of a connector housing. A spring is used to bias the ferrule assembly in a distal direction relative to the connector housing. The ferrule functions to support an end portion of at least one optical fiber (in the case of a multi-fiber ferrule, the ends of multiple fibers are supported). The ferrule has a distal end face at which a polished end of the optical fiber is located. When two fiber optic connectors are interconnected, the distal end faces of the ferrules abut one another and the ferrules are forced proximally relative to their respective connector housings against the bias of their respective springs. With the fiber optic connectors connected, their respective optical fibers are coaxially aligned such that the end faces of the optical fibers directly oppose one another. In this way, an optical signal can be transmitted from optical fiber to optical fiber through the aligned end faces of the optical fibers. U.S. Pat. Nos. 5,883,995 and 6,142,676, which are hereby incorporated by reference in their entireties, disclose a ferrule-less fiber optic connector having an optical fiber having a ferrule-less end portion that is accessible at a front end of a connector body of the fiber optic connector. U.S. Pat. No. 6,957,920, which is hereby incorporated by reference in its entirety, discloses a multi-fiber ferrule having protruding optical fibers.

The manufacturing process of optical connectors typically consists of 8-15 steps generalized as: Fiber and Cable Preparation, Epoxy and Cure, Cleave, Epoxy Removal, Polish, and others. Arguably, the most performance-critical step in the manufacture of optical connectors lies in the geometry formation process (Cleaving through Polish). These steps greatly influence the fiber's physical contact between adjoining optical connectors and ultimately determine a connector's ability to transmit (optical signal power coupling loss) and reflect the transmission signal.

Polishing is a multi-step process where the end-face of the ferrule and the fiber are gradually worked and reshaped using different grade polishing materials until the desired radius, angle, flatness and surface quality (roughness) is achieved. The number of polishing steps is connector dependent, ranging from 3 or 4 steps for simplex connectors, to 5 or 6 steps in multi-fiber connectors. Generally, polishing is time consuming, labor intensive and messy. In an effort to reduce manufacturing cycle time, reduce manufacturing complexity, and, ultimately remove manufacturing costs, it is desirable to reduce the number of steps required for polishing a connector.

SUMMARY

One aspect of the present disclosure relates to ferrule and fiber processing methods utilized to reduce or eliminate dependence upon abrasive mechanical polishing techniques. In certain examples, processing techniques using non-contact energy sources (e.g., plasma discharges, lasers, torches, infrared heating, etc.) can be used to remove undesired material (residues such as adhesive (e.g., epoxy), dust, electrostatic particles, or other contaminants) from the end face of a ferrule and/or the end face of an optical fiber supported by the ferrule. In certain examples, the processing techniques can be implemented after the optical fiber has been axially fixed within the ferrule. In certain examples, the processing to remove undesired materials can eliminate the need for subsequent polishing steps. In other examples, the processing to remove undesired materials can be used in combination with a subsequent mechanical polishing step for finishing or shaping the optical fiber end. Mechanical polishing can also be used to adjust a fiber protrusion length relative to the ferrule. However, by using non-contact processing steps, subsequent mechanical polishing steps can be less substantial as compared to if mechanical polishing were also used to remove the undesired materials.

Processing techniques as disclosed herein can be used with respect to optical fibers having end faces that are forwardly offset, flush or recessed relative to the end faces of their corresponding ferrules. Aspects of the present disclosure are applicable to the processing of both single fiber and multi-fiber ferrules. After an optical fiber has been secured relative to a corresponding ferrule, non-contact processing techniques of the type disclosed herein can be used to remove undesired material from the optical fiber and the ferrule and/or can be used to modify the end face of the optical fiber supported by the ferrule after the optical fibers have been secured in their respective ferrules. For example, the processing techniques can be used to shape the optical fiber ends (e.g., to provide desired fiber tip radii or other shaping) or to re-flow the optical fiber ends to remove scratches or other imperfections that may negatively affect optical signal transmission.

In certain examples of the present disclosure, the optical fiber can be cleaved and processed prior to insertion in its corresponding ferrule. For example, the optical fiber can be mechanically or laser cleaved prior to insertion in its corresponding ferrule. Also, the optical fiber can be pre-processed (e.g., processed by techniques such as mechanical polishing or the application of a non-contact energy source) to shape the optical fiber (e.g., provide a desired fiber tip radius) and/or treat the end face of the optical fiber to remove imperfections.

In one aspect, the present disclosure relates to a method for processing an optical fiber and for securing the optical fiber to a ferrule. The ferrule includes a ferrule body having a distal end and a proximal end. The ferrule body also defines a fiber opening that extends axially through the ferrule body from the proximal end to the distal end. The method can include the steps of: 1) processing a distal end face of the optical fiber so as to form a pre-processed end face of the optical fiber; 2) applying adhesive within the fiber opening of the ferrule body; 3) inserting the optical fiber with the pre-processed end face through the adhesive filled opening of the ferrule body and positioning the optical fiber within the fiber opening such that the pre-processed end face of the optical fiber is located at a pre-determined axial position relative to the distal end of the ferrule body; 4) curing the adhesive to fix the optical fiber within the fiber opening such that the pre-processed end face of the optical fiber is fixed at the pre-determined axial position relative to the distal end of the ferrule body; and 5) removing excess adhesive from the pre-processed end face of the optical fiber using a non-contact energy source.

Another aspect of the present disclosure relates to a method that can include the steps of: 1) pre-processing an end face of the optical fiber; 2) inserting the pre-processed fiber through a ferrule; 3) retracting the pre-processed fiber back into the ferrule; 4) wiping excess adhesive from an end face of the pre-processed fiber; 5) setting an exact fiber position within the ferrule; 6) cure the adhesive; and 7) remove excess adhesive from the end face of the pre-processed fiber with a non-contact energy source.

A further aspect of the present disclosure relates to a method for processing a ferrule supporting a beam expansion structure (e.g., a lens such as a GRIN lens). In certain examples, an optical waveguide including a lens (e.g., a GRIN lens fused to an optical fiber) is positioned within a ferrule. In certain examples, the lens can be mounted (e.g., secured, retained, bonded, axially fixed, etc.) within an opening defined by the ferrule. In certain examples, the lens can be axially fixed relative to the ferrule (e.g., with an adhesive such as epoxy) with an end face of the lens set at a desired axial position relative to an end face of the ferrule. In certain examples, the end face of the lens can be forwardly offset, flush or recessed relative to the end face of the ferrule. In certain examples, a non-contact energy source (e.g., a laser, plasma discharge, or other energy source) can be used to remove undesired material (e.g., adhesive, contaminants, dust, etc.) from the end face of the lens after the lens has been axially fixed relative to the ferrule.

Yet another aspect of the present disclosure relates to an APC connector with an end face of a ferrule angled relative to a central axis of an optical fiber. In one example, the end face is angled about 8 degrees relative to the central axis of the optical fiber. In the case of an APC connector, an example method includes the steps of: 1) pre-processing an end face of an optical fiber; 2) applying adhesive in a fiber passage defined by a ferrule; 3) inserting the pre-processed optical fiber into the opening containing the adhesive; 4) setting an axial position of the optical fiber within the ferrule; 5) removing excess adhesive from the pre-processed end face of the optical fiber using a non-contact energy source; 6) determining a core offset of the optical fiber; and 7) polishing the end face of the ferrule to achieve a 8 degree angle relative to the core offset of the optical fiber.

A variety of additional aspects will be set forth in the description that follows. The aspects relate to individual features and to combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

FIG. 18 is a flow chart illustrating another method for establishing end face geometries for optical fibers and/or a generally rectangular multi-fiber ferrule supporting the optical fibers in accordance with the principles of the present disclosure.

FIG. 19 is an end view of a multi-fiber ferrule in accordance with the principles of the present disclosure.

FIG. 20 is a side view of the multi-fiber ferrule of FIG. 19.

FIG. 21 is a bottom view of the multi-fiber ferrule of FIG. 19.

DETAILED DESCRIPTION

Figure 1:
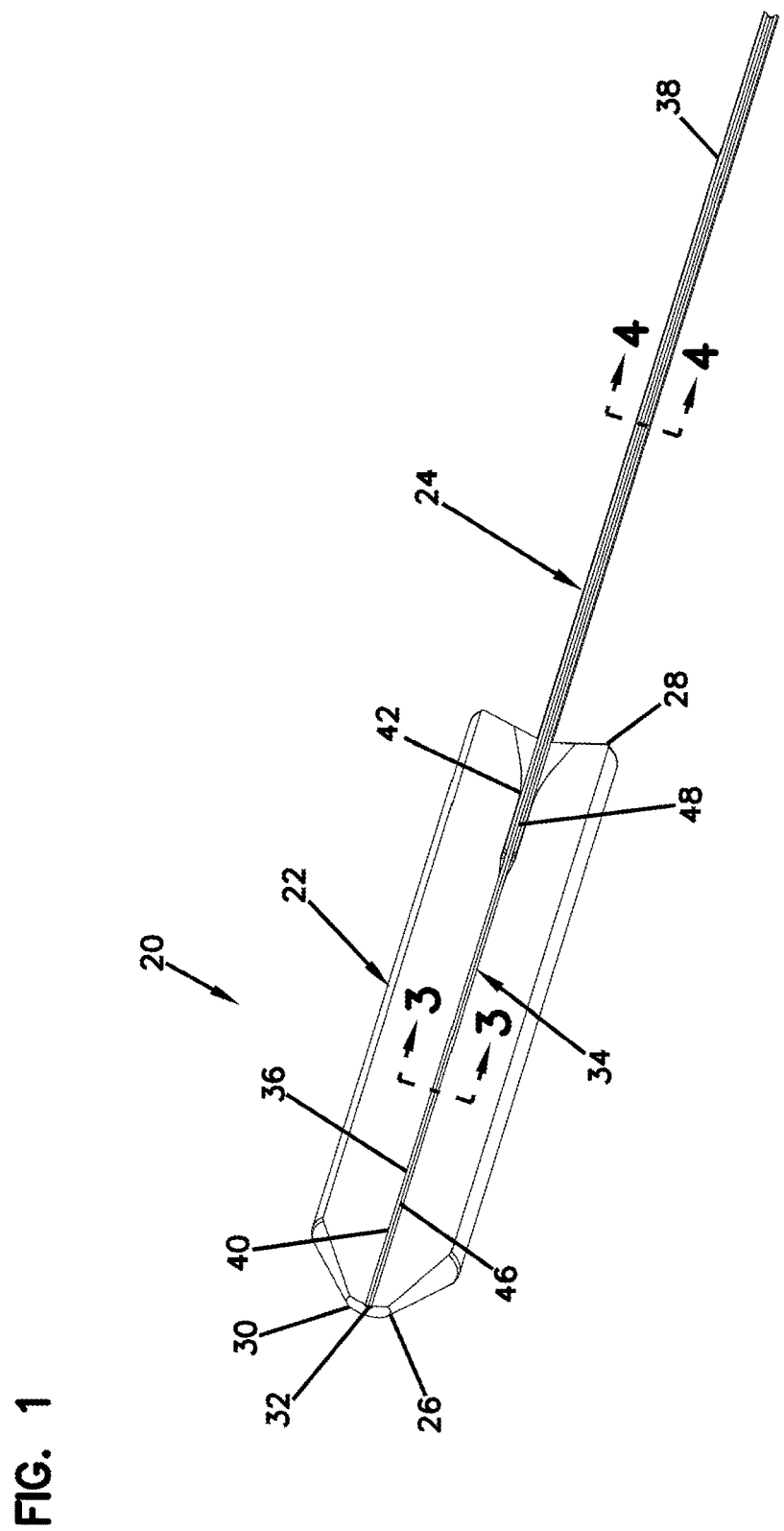
FIG. 1 is a front, perspective, cross-sectional view of a ferrule assembly in accordance with the principles of the present disclosure.

Aspects of the present disclosure relate to the effective use of non-contact energy source treatment techniques to simplify operations and reduce cost associated with manufacturing an optical component including a ferrule supporting an optical fiber. Traditionally, the significant reliance upon mechanical polishing operations including abrasives (e.g., abrasive flocks, abrasive slurries, abrasive pads or discs, etc.) results in substantial cost and complexity associated with processing optical fibers and their corresponding ferrules. Certain aspects of the present disclosure relate to the use of non-contact energy source treatment techniques to replace one or more mechanical polishing steps. Certain aspects relate to ferrule and optical fiber processing methods that do not require any mechanical polishing steps. Other aspects relate to ferrule and fiber processing methods that reduce the number, complexity or abrasiveness of the mechanical polishing steps used. Processes of the present disclosure are applicable to single fiber ferrules and multi-fiber ferrules.

As used herein, non-contact energy source treatment techniques relate to treatment techniques that do not require direct mechanical contact with the contact ferrule/optical fiber but instead involve exposing the ferule and/or optical fiber to an energy source which brings about a desired treatment result. One example non-contact energy source treatment technique involves exposing the ferrule/optical fiber to a plasma such as the arc discharge caused by electrical current breaking down and flowing through a normally nonconductive media (e.g., air) between two spaced-apart electrodes. In this regard, corona treatment devices can be used to ionize air by applying a voltage between two pointed electrodes to generate a corona discharge plasma between the electrodes. By exposing a surface desired to be treated to the plasma, the characteristics of the surface can be altered and/or materials can be removed. Another example non-contact energy source treatment technique involves exposing the ferrule and/or optical fiber to a laser beam. An example device for generating such a laser beam includes a carbon dioxide ($CO_2$) laser. Further examples of non-contact energy source treatment techniques involve exposing the ferrule and/or optical fiber to a torch flame (e.g., from a gas torch), exposing the ferrule/optical fiber to infrared heat from an infrared heat source, and exposing the ferrule/optical fiber to certain types of electromagnetic wave-based energy sources.

The various methods disclosed herein can be used to manufacture ferrule/fiber assemblies having optical fiber tips that project distally beyond and end face of the ferrule, are flush relative to the end face of the ferrule, or are recessed relative to the end face of the ferrule. In the case of single fiber ferrules, in certain examples, a final fixed tip position of the optical fiber can be in the range of −125 microns (i.e., recessed up to and including 125 microns) to +50 microns (i.e., protruding up to and including 50 microns) relative to an end face of the ferrule. In the case of multi-fiber ferrules, in certain examples, the optical fibers can have final fixed tip positions that protrude 30 to 50 microns beyond the end face of the ferrule.

One aspect of the present disclosure relates to the use of a non-contact energy source to remove unwanted material from the end face of a ferrule and/or the tip of an optical fiber supported by the ferrule. In certain examples, the ferrule can be a multi-fiber ferrule or a single fiber ferrule. In certain examples, the unwanted material includes residue of an adhesive (e.g., epoxy) used to retain an optical fiber within the ferrule. In certain examples, a non-contact energy source can be used to expedite a cure time of the adhesive used to secure the optical fiber within the ferrule. In certain examples, the unwanted material can include a contaminant such as dust or debris. In certain examples, the non-contact energy source can be used to remove material from the face of an optical fiber that is recessed relative to the corresponding ferrule face. This allows the material to be removed without changing the distance the optical fiber tip is recessed relative to the ferrule end face. In certain examples, the non-contact energy source can be used as an electrostatic cleaner. In certain examples, the removal of the unwanted materials (e.g., adhesive or contaminants) using the non-contact energy source can be a final step in preparing the end face of the ferrule and/or the fiber tip. In this example, after removal of the material, the optical fiber tip has a resultant surface quality and shape that further processing is not needed to satisfy pertinent performance standards relating to optical signal loss (e.g., insertion loss, return loss, etc.).

In certain examples, the removal of the unwanted materials (e.g., adhesive or contaminants) using the non-contact energy source can be an intermediate step in preparing the end face of the ferrule and/or the fiber tip so as to simplify subsequent steps. In such examples, after material has been removed using the non-contact energy source, the end of the ferrule and/or the optical fiber tip can be subsequently processed using mechanical polishing techniques or further non-contact energy source applications to further process the end of the ferrule and/or the fiber tip. Such subsequent processing steps can be used to control the degree of protrusion of the optical fiber (e.g., mechanical polishing, plasma treatment or laser ablation can be used to remove material of the ferrule to increase fiber protrusion; mechanical polishing, plasma treatment or laser ablation can be used to remove material from the optical fiber to decrease fiber protrusion). Such subsequent processing steps (mechanical polishing or non-contact energy techniques) can also be used to modify the fiber tip shape and/or the ferrule end shape (e.g., the ferrule can be stepped, the ferrule can be rounded, the ferrule end surface and the fiber tip can be angled, the fiber tip can be treated to remove imperfections, the fiber tip can be rounded to a desired tip radius, etc.).

Another aspect of the present disclosure relates to the use of a non-contact energy source to process the fiber tip of an optical fiber after the optical fiber has been secured in a ferrule. For example, the non-contact energy source can be used to shape the fiber tip or re-flow the surface of the fiber tip after the optical fiber has been secured to within the ferrule. Shaping the fiber tip can include modifying the fiber tip to include at least some curvature. In certain examples, the fiber tip and the ferrule end are modified in shape so as to comply with industry standards for end face geometry. In certain examples, the fiber tip can be provided with at a least portion having a spherical shape of a desired radius. In certain examples, re-flowing the surface of the fiber tip can assist in reducing loss-inducing imperfections in the surface. Shaping can be particularly effective for optical fibers that have been set relative to their corresponding ferrules so that the fiber tip protrudes beyond the ferrule end face, but can also be used for flush and recessed fiber tips. Re-flowing is equally applicable to protruding, flush and recessed fiber tips. It will be appreciated that this type of processing can be a final processing step that results in the fiber having a fiber tip shape and surface quality suitable for meeting pertinent optical performance standards relating to loss (e.g., return loss, insertion loss, etc.). In this type of example, the non-contact processing can follow earlier processing operations (e.g., adhesive removal, polishing, ferrule removal/shaping, etc.). In other examples, the non-contact processing can be followed by subsequent processing operations (e.g., polishing, further non-contact processing, etc.).

Another aspect of the present disclosure relates to the use of a non-contact energy source to process the fiber tip of an optical fiber before the optical fiber has been secured in a ferrule. For example, the non-contact energy source can be used to shape the fiber tip or re-flow the surface of the fiber tip before the optical fiber has been secured to within the ferrule. Shaping the fiber tip can include modifying the fiber tip to include at least some curvature. In certain examples, the fiber tip can be provided with at a least portion having a spherical shape of a desired radius. In certain examples, re-flowing the surface of the fiber tip can assist in reducing loss-inducing imperfections in the surface. In certain examples, the ferrule can be pre-made with a desired shape prior to insertion of the optical fiber within the ferrule. For example, the ferrule can be pre-molded or pre-processed so as to have a desired end shape, polish level, angle, or other characteristic. With a pre-shaped ferrule and a pre-processed optical fiber, minimal processing may be needed after the optical fiber has been secured within the ferrule. In certain examples, subsequent processing may include using a non-contact energy source to remove excessive adhesive from the optical fiber tip and the end face of the ferrule after adhesive has been used to secure the optical fiber within the ferrule.

In certain examples, a laser is used to process an end face of an optical fiber before or after the optical fiber is loaded into an adhesive filled fiber passage within a ferrule. Characteristics of the laser (focal spot intensity, interaction time, wave length, pulse length) are selected so that the laser effectively rounds and shapes the end face and helps remove imperfections. The laser can also be used to process the end of the ferrule to shape the ferrule, to impart structural features in to the ferule (e.g., steps) or to ablate portions of the ferrule to modify fiber protrusion lengths.

In other examples, a plasma treatment or other energy source can be used to process the end face of the optical fiber and/or the end of the ferrule. A typical plasma discharge is generally ball shaped and is defined in the arc region between two electrodes. Typically, the plasma discharge has a relatively small volume. Thus, to provide coverage over the full end face of a ferrule or fiber, it may be necessary to generate relative lateral movement between the ferrule/fiber and the plasma discharge. This can be accomplished by moving the energy source relative to the ferrule/fiber or by moving the ferrule/fiber relative to the energy source. In this way, the focal point of the energy source can be scanned, indexed or otherwise manipulated across the end of the ferrule or the fiber to provide full coverage or to provide desired shaping at particular regions. It will be appreciated that the shape of the plasma discharge may be altered to modify the focal/active area of the discharge. In one example, air from one or more sources can be directed at the plasma discharge to alter the shape of the discharge. In certain examples, the shape of the discharge can be widened to provide a larger coverage area during ferrule/fiber processing. In certain examples, one or more streams (e.g., currents) of air can be directed at the plasma discharge to alter the discharge shape. The streams can be pulsed or continuous. In the case of multiple streams, the streams of air can be directed from opposite directions toward the discharge, can be directed from the same direction toward the discharge, can be angled relative to one another or can be parallel to one another. To control the processing temperature at the ferrule or the fiber, one or more heat sinks can be positioned adjacent to the distal end of the fiber or the ferrule to draw heat away from the processing region. Similarly, the non-contact energy source can be pulsed on and off to prevent the processing temperature from exceeding a determined level or to maintain the processing location at the ferrule/fiber at a predetermined temperature. Pulsing allows for heat dissipation between pulses.

Figure 2:
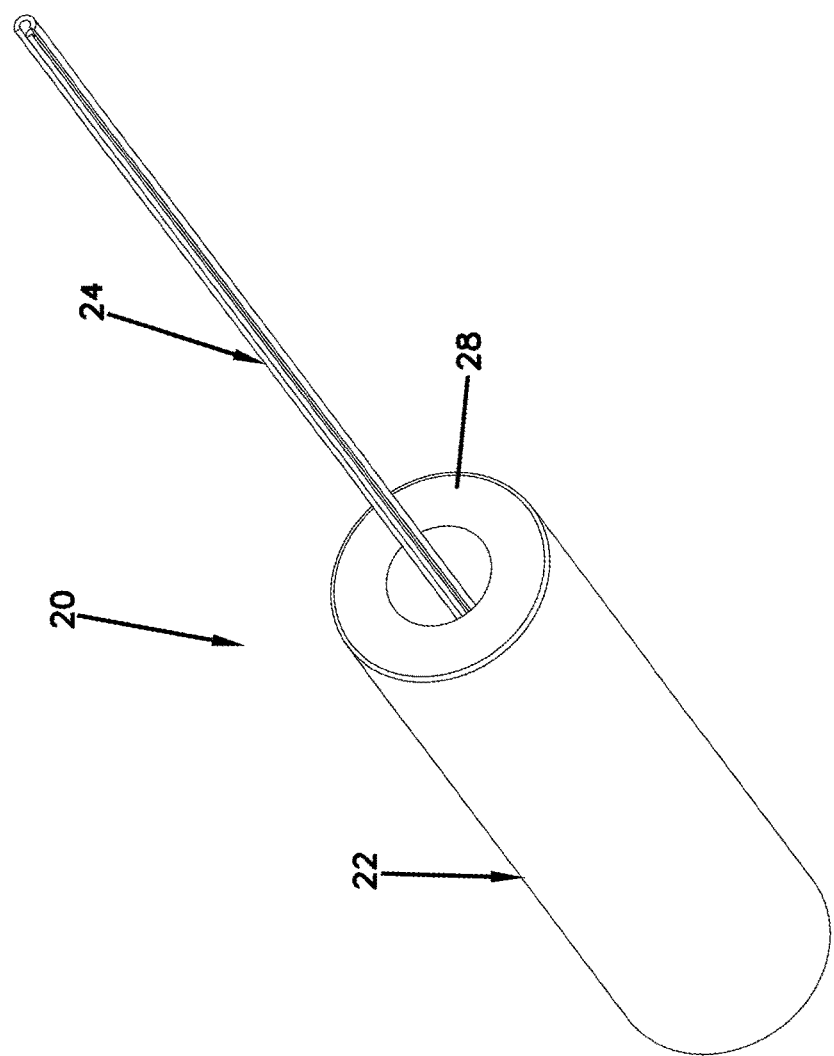
FIG. 2 is a rear, perspective view of the ferrule assembly of FIG. 1.

FIGS. 1 and 2 illustrate one example ferrule assembly 20 which is suitable for practicing aspects of the present disclosure. The ferrule assembly 20 includes a ferrule 22 and an optical fiber 24 secured to the ferrule 22. In one example, the ferrule 22 is generally cylindrical. In one example, the ferrule has a diameter in the range of 1-3 millimeters or in the range of 1.25-2.5 millimeters. Example ferrules include SC ferrules and LC ferrules. The ferrule 22 includes a front end 26 positioned opposite from a rear end 28. The front end 26 preferably includes an end face 30 at which an interface end 32 of the optical fiber 24 is located. The ferrule 22 defines a ferrule bore 34 that extends through the ferrule 22 from the front end 26 to the rear end 28. The optical fiber 24 includes a first portion 36 secured within the ferrule bore 34 and a second portion 38 that extends rearwardly from the rear end 28 of the ferrule 22. The first portion 36 of the optical fiber 24 is preferably secured by an adhesive (e.g., epoxy) within the ferrule bore 34 of the ferrule 22. The interface end 32 preferably includes a processed end face accessible at the front end 32 of the ferrule 22.

The ferrule 22 is preferably constructed of a relatively hard material capable of protecting and supporting the first portion 36 of the optical fiber 24. In one embodiment, the ferrule 22 has a ceramic construction. In other embodiments, the ferrule 22 can be made of alternative materials such as Ultem, thermoplastic materials such as Polyphenylene sulfide (PPS), other engineering plastics or various metals. In one example, the ferrule 22 can be a single fiber ferrule such as a ferrule for and SC connector, and ST connector, or an LC connector. While FIGS. 1 and 2 depict a single fiber ferrule, aspects of the present disclosure are also applicable to multi-fiber ferrules such as MT-ferrules and MPO ferrules. A typical multi-fiber ferrule can have a generally rectangular shape and can support a plurality of optical fibers supported in one or more rows by the multi-fiber ferrule.

Figure 5:
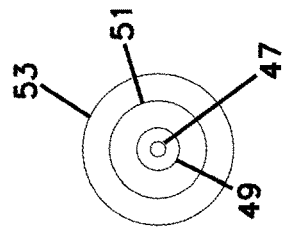
FIG. 5 is a cross-sectional view showing an alternative configuration for the coated fiber portion of FIG. 4.
Figure 4:
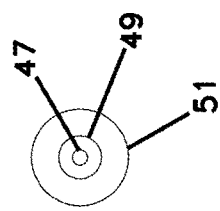
FIG. 4 is a cross-sectional view taken along section line 4-4 of FIG. 2, the cross-section shows a coated fiber portion of the ferrule assembly.
Figure 3:
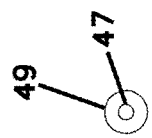
FIG. 3 is a cross-sectional view taken along section line 3-3 of FIG. 1, the cross-sectional view shows a bare fiber portion of an optical fiber of the ferrule assembly.

The first portion 36 of the optical fiber 24 can include a bare fiber segment 46 that fits within a first bore segment 40 of the ferrule 22 and a coated fiber segment 48 that fits within a second bore segment 42 of the ferrule 22. The bare fiber segment 46 is preferably bare glass and, as shown at FIG. 3, includes a core 47 surrounded by a cladding layer 49. In certain embodiments, the coated fiber segment 48 includes one or more coating layers 51 surrounding the cladding layer 49 (see FIG. 4). In certain embodiments, the coating layer or layers 51 can include a polymeric material such as acrylate having an outer diameter in the range of about 230-260 microns. In still other embodiments, the coating layer/layers 51 can be surrounded by a buffer layer 53 (e.g., a tight or loose buffer layer) (see FIG. 5) having an outer diameter in the range of about 500-1100 microns.

Figure 6:
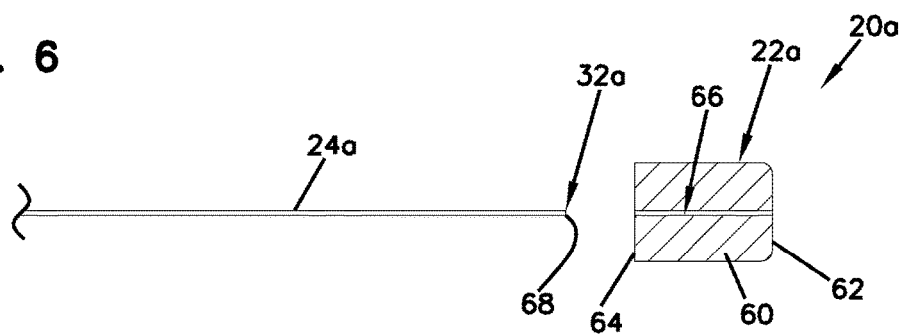
FIGS. 6-10, 10A, 11 and 12 illustrate a sequence of steps for securing the optical fiber within a ferrule in accordance with the principles of the present disclosure.

FIGS. 6-10, 10A, 11 and 12 show a sequence of steps in accordance with the principles of the present disclosure for processing a ferrule assembly 20a including an optical fiber 24a to be secured to the ferrule 22a. FIG. 6 shows the example ferrule 22a including a ferrule body 60 having a distal end 62 and a proximal end 64. The ferrule body 60 defines a fiber opening 66 that extends axially through the ferrule body 60 from the proximal end 64 to the distal end 62.

It will be appreciated that an interface end 32a (i.e., a distal end face) of the optical fiber 24a has been pre-processed. For example, the end of the optical fiber 24a has been cleaved (e.g., mechanically or via a non-contact energy source such as a laser). Also, the interface end 32a has been pre-processed to shape (e.g., round as described above) the interface end 32a and to remove imperfections. The pre-processing can include shaping steps and imperfection removing steps of the type described previously using mechanical polishing operations and/or non-contact energy application operations of the type described above. Thus, the optical fiber 24a depicted has a pre-processed end face 68 before it is loaded into the ferrule 22a. It will be appreciated that the ferrule 22a can also be pre-manufactured (e.g., molded, machined, etc.) with a desired shaped, size and/or end-face configuration.

Figure 7:
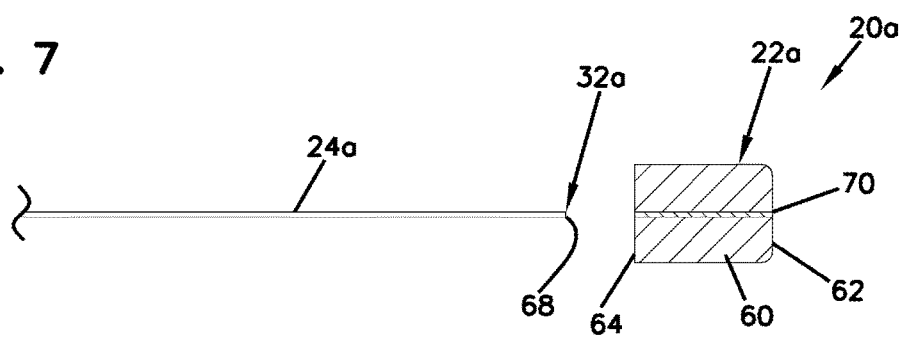
Figure 8:
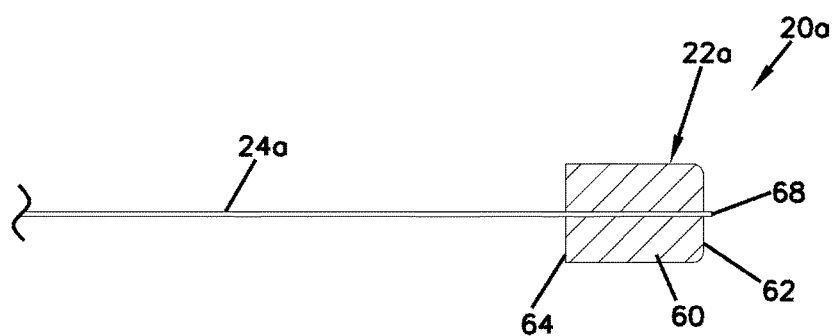
Figure 9:
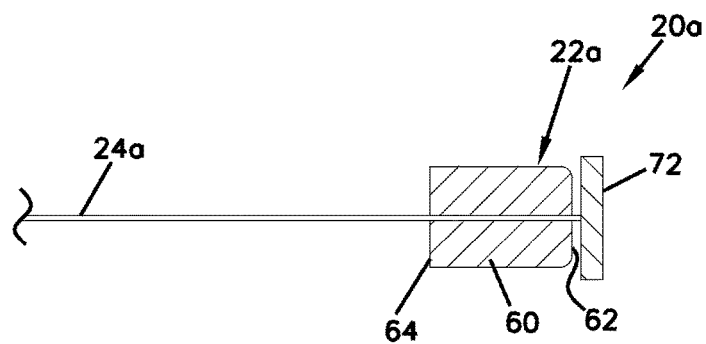
Figure 10:
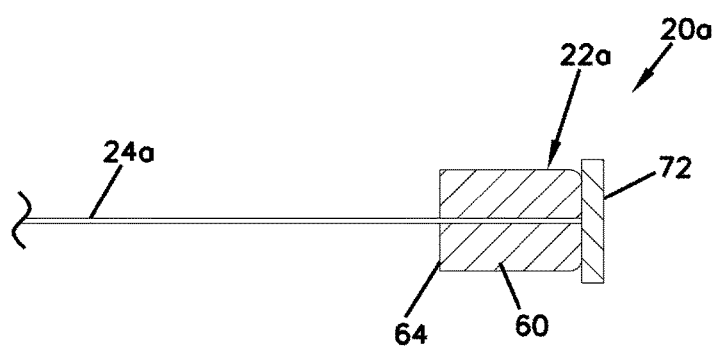
Figure 10A:
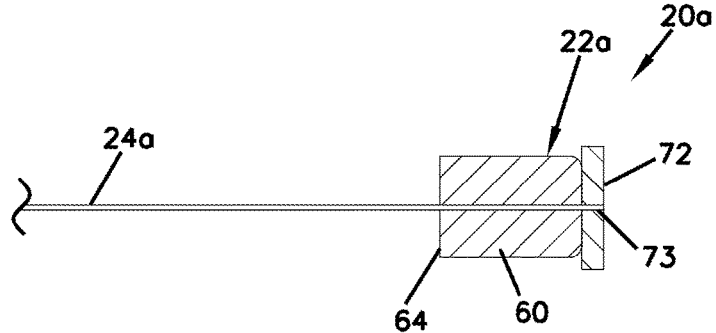

As shown at FIG. 7, the fiber opening 66 of the ferrule body 60 has been filled with an adhesive 70 such as epoxy. An adhesive injection process can be used to fill the fiber opening 66 with adhesive. Once the opening 66 has been filled with the adhesive 70, the optical fiber 24a can be inserted in a distal direction through the fiber opening 66. FIG. 8 shows the optical fiber 24a after insertion through the adhesive-filled opening 66 with the pre-processed end face 68 extending distally past/beyond the distal end 62 of the ferrule body 60. It will be appreciated that as the optical fiber 24a is moved distally through the fiber opening 66, at least some of the adhesive can be distally displaced from the opening 66 and pushed out the distal end of the opening 66. This displaced adhesive can be deposited on the distal end 62 of the ferrule 60 and on the end face 68 of the optical fiber 24a. After the optical fiber 24a has been fully inserted through the ferrule 22a, the optical fiber 24a can be retracted proximally relative to the ferrule 22a so that the end face 68 of the optical fiber 24a is slightly recessed relative to the distal end face of the ferrule 22a. A physical/mechanical wiping step can be used to remove at least some of this displaced adhesive 70 from the distal end of the ferrule 22a and the fiber end face 68. However, even after wiping, at least some adhesive residue will typically remain on the fiber end face 68 and on the distal end 62 of the ferrule 60.

After wiping of the adhesive, the optical fiber 24a can be moved distally relative to the ferrule 22a to establish a desired spatial relationship between the distal end of the ferrule 22a and the distal tip of the optical fiber 24a. In this way, the optical fiber 24a can be positioned within the fiber opening 66 such that the pre-processed end face 68 of the optical fiber 24a is located at a pre-determined axial position relative to the distal end 62 of the ferrule body 60. In certain aspects, a flat plate 72 (e.g., optical flat) (see FIGS. 9 and 10) or other type of mechanical stop may be used as a fiber stop to set/establish a desired axial position of the optical fiber 24a relative to the distal end 62 of the ferrule body 60. The stop can include a stop surface against which the optical fiber tip abuts to stop distal movement of the optical fiber 24a relative to the ferrule 22a at a desired position. In one example, the mechanical stop can have a material composition that includes sapphire. In one example, the flat plate 72 can define an opening 73 (see FIG. 10A) for allowing excess adhesive 70 to pass therethrough as the optical fiber 24a is inserted through the fiber opening 66. In certain aspects, this can help to eliminate or reduce the need for the adhesive wiping step. The fiber opening 66 can be smaller than a diameter of the bare glass portion of the optical fiber 24a, but large enough to accommodate at least some of the displaced adhesive from the fiber opening 66. The stop surface of the plate 72 can have a predefined distal offset from the end face of the ferrule 22a to stop the distal tip of the optical fiber 24a at a desired distal projection from the end face of the ferrule 22a. Alternatively, the stop surface of the plate can be flush with the distal end face of the ferrule 22a to stop the distal tip of the optical fiber 24a at a flush spatial relationship relative to the distal end face of the ferrule 22a. Further, the stop surface of the plate can project into the fiber opening 66 of the ferrule 22a to stop the distal tip of the optical fiber 24a at a proximally recessed spatial relationship relative to the distal end face of the ferrule 22a.

Once the desired relative positioning between the ferrule distal end 62 and the fiber end face 68 has been established, the adhesive 70 is cured within the fiber opening 66 to axially fix the optical fiber 24a within the fiber opening 66 such that the pre-processed end face 68 of the optical fiber 24a is fixed at the pre-determined axial position relative to the distal end 62 of the ferrule body 60. In certain examples, plasma or other energy means can be used to tack cure the adhesive 70 at the distal end 62 of the ferrule body 60 to allow the process to proceed without having to wait for a full adhesive cure time associated with ambient temperature curing. The energy means can reduce the curing time by heating the adhesive 70 (e.g., for a thermos-set adhesive) or by applying radiation (e.g., ultraviolet radiation (UV)) in the case of a radiation (e.g., UV) curable adhesive.

Figure 11:
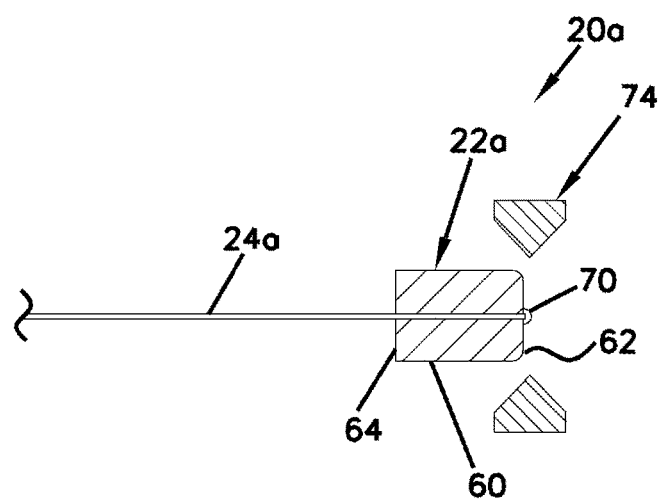
Figure 12:
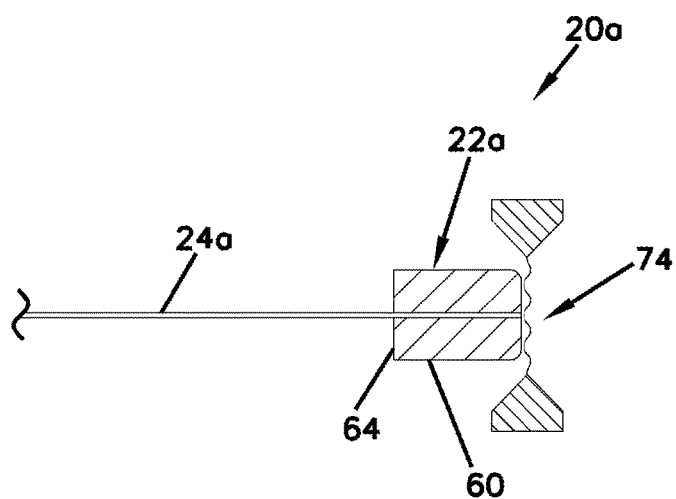

FIG. 11 shows the optical fiber 24a being exposed to a non-contact energy source 74 (e.g., laser, plasma discharge arc, infrared heat, etc.) to remove (e.g., ablate, vaporize, etc.) excess adhesive 70 (i.e., adhesive residue) from the pre-processed end face 68 of the optical fiber 24a (see FIG. 12). In certain aspects, the excess adhesive 70 (i.e., adhesive residue) can also be removed from the distal end 62 of the ferrule body 60 using the non-contact energy source. This leaves a clean, undamaged ferrule end face and fiber tip. The plasma discharges can be pulsed with pauses between the discharges to control the temperature at the distal end 62 of the ferrule body 60. In other aspects, one or more heat sink structures may be used to transfer heat away from the distal end 62. Epoxy within the fiber opening 66 between the optical fiber 24a and the ferrule 22a is not removed because the ferrule 22a provides thermal protection (i.e., thermal insulation and isolation from the heat at the end face of the ferrule) that prevents such adhesive from being heated to a temperature sufficient to cause removal of the adhesive.

In certain aspects, the above process described with respect to FIGS. 6-10, 10A, 11 and 12 can result in a final ferrule assembly that does not require further processing. In other examples, the above process describe with respect to FIGS. 6-12 can be used in combination with one or more subsequent steps such as polishing steps. For example, polishing can be used to further shape the distal end face of the optical fiber 24a or remove imperfections from the distal end face of the optical fiber 24a after the adhesive 70 has been removed using a non-contact energy source.

Certain aspects of the present disclosure are applicable to ferrule assemblies that may include specialized optical fibers, lenses, or other structures. In one example, aspects of the present disclosure are applicable to a ferrule assembly including a ferrule supporting a graded index (GRIN) lens adjacent the distal end of the ferrule for allowing the ferrule assembly to function as part of an expanded beam fiber optic connector. The GRIN lens can be formed by a graded index optical fiber. It will be appreciated that modifying the length of the graded index optical fiber modifies the amount of expansion provided by the graded index optical fiber. This can present an issue where polishing operations used to remove adhesive from the end of the graded index optical fiber shorten the length of the graded index optical fiber thereby modifying the expansion level provided by the graded index optical fiber. By using a non-contact energy source to remove adhesive from the end of the graded index optical fiber, the adhesive can effectively be removed without altering the length of the graded index optical fiber. In this way, the expansion level provided by the graded index optical fiber is not modified.

Figure 13:
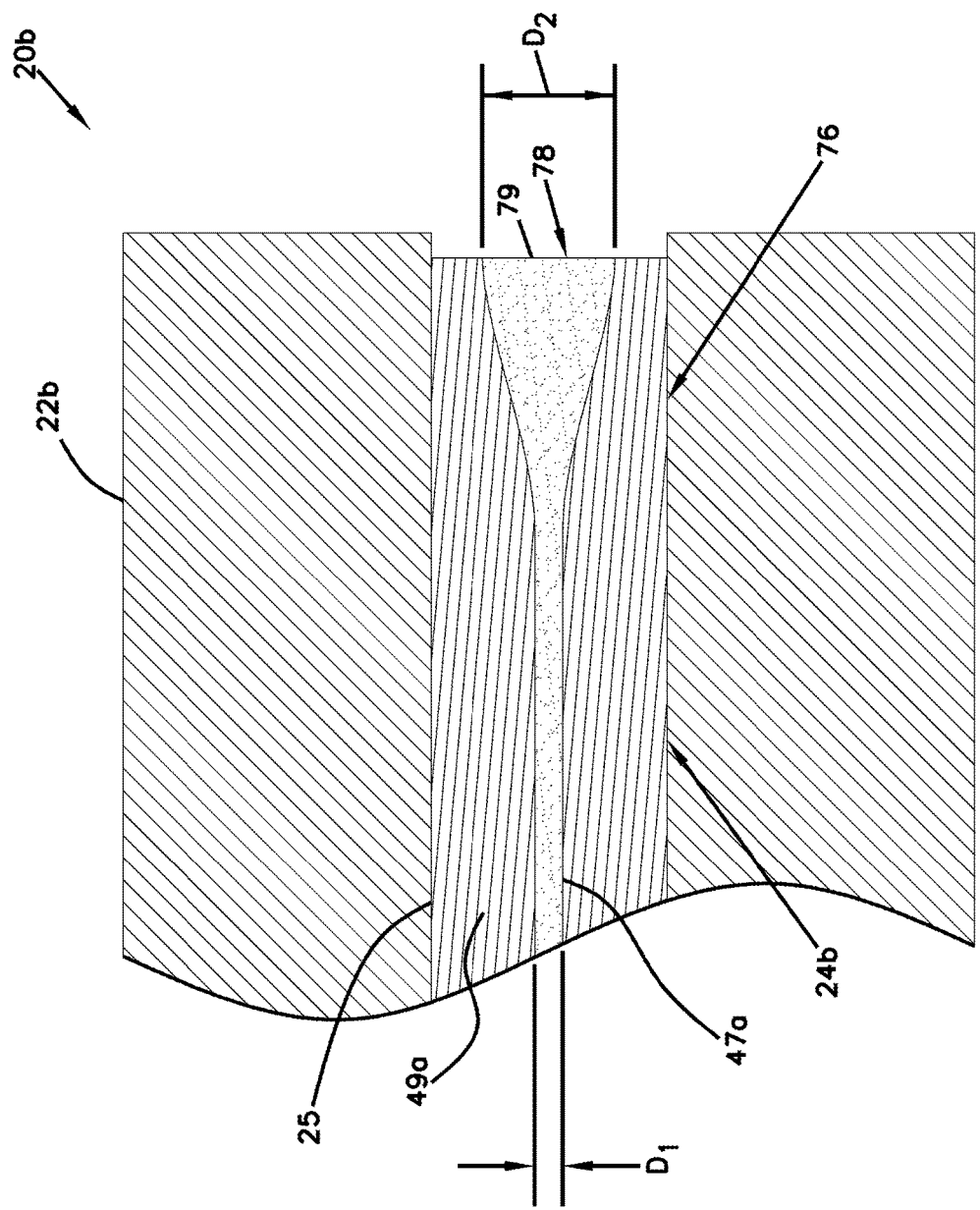
FIG. 13 is a schematic, longitudinal cross-sectional view showing a mode field for the optical fiber spliced to a GRIN lens fiber within a ferrule in accordance with the principles of the present disclosure.

FIG. 13 shows an example ferrule assembly 20b suitable for use in an expanded beam fiber optic connector. The ferrule assembly 20b can be processed using operations of the type disclosed herein. In one example, the ferrule assembly 24b can include a ferrule 22b supporting an optical fiber structure 24b. The optical fiber structure 24b may include a beam expansion section 76 spliced to an optical fiber 25 (e.g., a single mode optical fiber). The optical fiber structure 24b is supported within the ferrule 22b and positioned with an end face 78 of the beam expansion section 76 recessed within the ferrule 22b. The beam expansion section 76 has a construction adapted to expand an optical beam from a first beam diameter D1 to an enlarged second beam diameter D2 (see FIG. 13). By recessing the end face 78 within the ferrule 22b, the ferrule assembly 20b is less sensitive to damage associated with debris (e.g., dust, sand, etc.) that may be trapped between the end faces 78 of two mated ferrule assemblies 20b in the field. For example, in physical contact connectors where the end faces of the ferrules abut when two ferrule assemblies are mated together, dust or sand compressed between the fiber end faces can scratch or otherwise damage the end faces. In contrast, because of the expanded beam construction, two of the ferrule assemblies 20b do not need to have physical contact between the end faces 78 of the optical fibers 24b to provide an acceptable optical connection. By recessing the end faces 78 relative to the distal ends of the ferrules 22b, sufficient space can be provided when the end faces 78 during an optical connection to accommodate dust/sand without damaging the end faces 78. In one example, the distal tips of the optical fibers are recessed 1-20 microns, or 5-20 microns, or 10-20 microns, or greater than 1 micron, or greater than 5 microns, or greater than 10 microns relative to their respective ferrule end faces.

FIG. 13 depicts an example mode field configuration for the optical fiber structure 24a. The optical fiber 25 has a core 47a surrounded by a cladding 49a. The beam expansion section 76 of the optical fiber 24a can be configured to expand a light beam traveling in a first direction through the beam expansion section 76 and to focus a light beam traveling in an opposite second direction through the beam expansion section 76. For example, the beam expansion section 76 expands light traveling though the beam expansion section 76 away from the optical fiber 25 and focuses light traveling through the beam expansion section 76 toward the optical fiber 25.

In certain examples, the beam expansion section 76 can include a collimator for expanding/focusing light including, for example, a lens or an expanded core of a fiber, in particular, a thermally-expanded core. In certain examples, the beam expansion section 76 can include a lens such as a graded index (GRIN) lens (e.g., a graded index fiber). A GRIN lens may be made with a core having a refractive index that varies generally parabolically as a function of the radius. For example, the GRIN lens can have a generally parabolic fiber refractive index profile that has a maximum value at the center of the core and that gradually decreases as the core extends radially away from the center of the core.

The amount of expansion provided by a GRIN lens is highly dependent upon the length of the GRIN lens. Thus, the length of the GRIN lens should be precisely controlled. Typically, this would be problematic in situations where a GRIN lens is provided at the end face of a ferrule of a fiber optic connector because polishing of the end face will alter the length of the GRIN lens thereby changing the collimating or focusing properties provided by the GRIN lens. However, this issue is overcome by the principles of the present disclosure because the optical fiber can be pre-processed such that no further polishing is required. Further details about the structure of a GRIN lens are disclosed at U.S. Pat. No. 7,031,567, which is hereby incorporated by reference in its entirety.

Typically, maximum expansion in a GRIN lens is achieved at quarter pitch and at each odd-integer multiple of the quarter pitch length. As indicated above, the amount of expansion provided by the GRIN lens is dependent upon its configuration and length. A quarter pitch is one quarter of the length of a full sinusoidal period that a light ray traverses in the lens. In certain examples, the length of the pitch can be calculated by the following formula:

$$l_{pitch} = \frac{\pi n_{core} D}{NA}$$

wherein n is the core refractive index, D is the physical core diameter, and NA is the numerical aperture. In certain examples, NA is in the range 0.11<NA<0.14. With the NA and the core index of refraction known or selected, the core diameter determines the pitch-length. The core diameter also establishes a beam expansion factor. As indicated above, maximum beam expansion occurs at the quarter pitch length and odd-integer multiples thereof. An example length of a quarter pitch of a GRIN lens is about 0.5-0.8 millimeters depending on the requirements. A GRIN lens typically has a length tolerance of about ±10 micrometers.

As used herein, "mode field" means the portion of an optical fiber through which light passes during a transmission through the optical fiber of a light signal having a predetermined wavelength. It will be appreciated that the "mode field" of a given optical fiber may vary depending upon the wavelength of the light signal being transmitted therethrough. As used herein, the "mode field area" is the transverse cross-sectional area of the mode field at a given location of the optical fiber. The "mode field area" is typically circular and defines a mode field diameter across the mode field area. The mode field diameter can be defined as where the power density is reduced to $1/e^2$ of the maximum power density. The mode field area can also be referred to as a "spot area" or "beam area" and the mode field diameter can also be referred to as the spot size or beam width.

Figure 15:
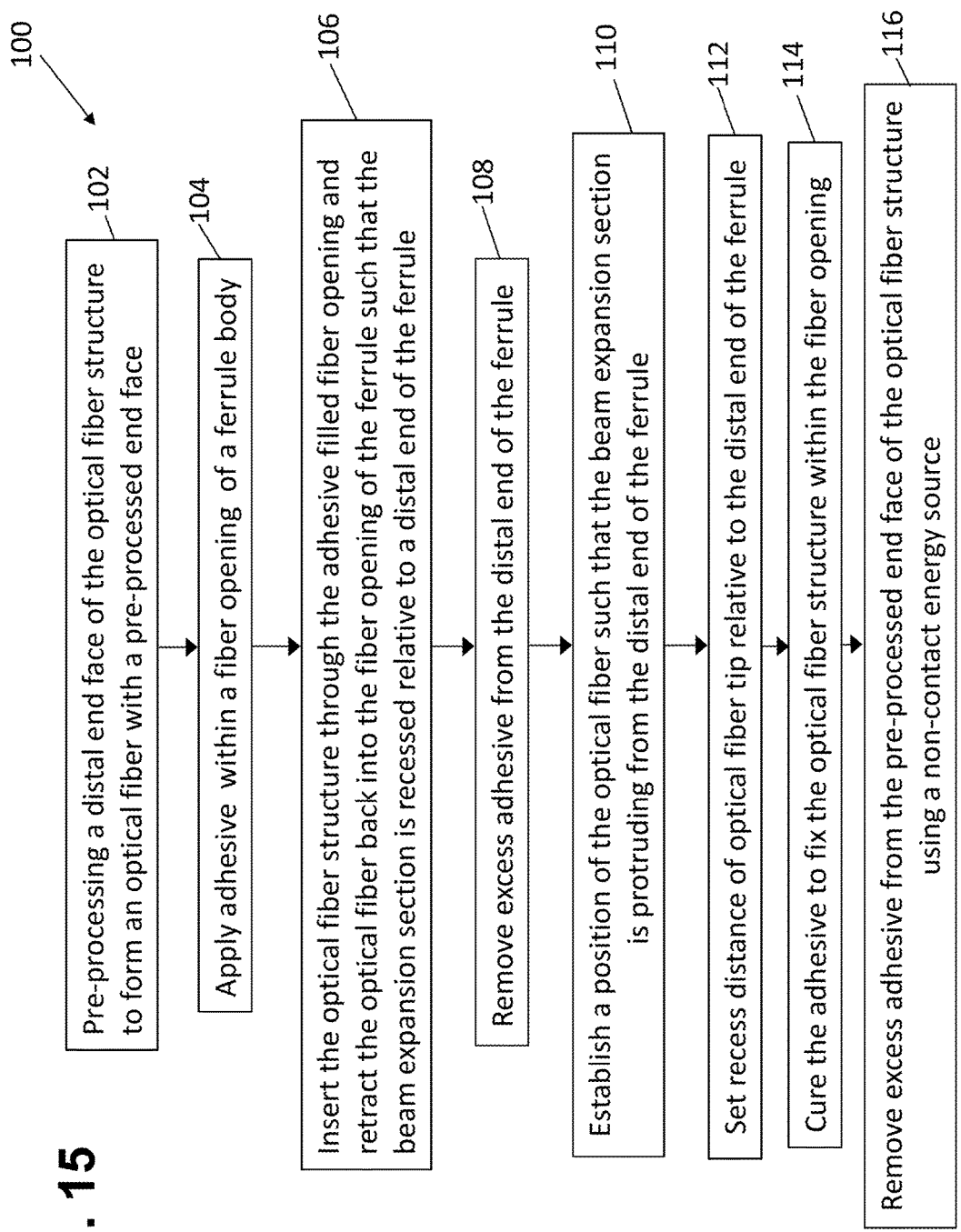
FIG. 15 is a flow chart illustrating a method for processing the optical fiber including the GRIN lens as shown in FIG. 13 in accordance with the principles of the present disclosure.

Referring to FIG. 15, a flow chart is illustrated showing another example method 100 for processing an expanded beam type ferrule assembly such as the ferrule assembly 20b. In this example, the method includes operations 102, 104, 106, 108, 110, 112, 114 and 116.

Operation 102 of the method 100 relates to pre-processing a distal end face of the optical fiber structure 24b so as to form the optical fiber with a pre-processed end face 78. The beam expansion section 76 can have a desired length after pre-processing. In certain examples, the pre-processed end face 78 can be covered with an anti-reflective coating material 79.

Operation 104 is performed to provide (e.g., inject) adhesive within a fiber opening 66b of the ferrule 22b. Operation 106 is performed to insert (e.g., distally push) the optical fiber structure 24b with the pre-processed end face 78 fully through the adhesive filled fiber opening 66b of the ferrule and then retracting (e.g., proximally pulling) the optical fiber structure 24b back into the fiber opening 66b of the ferrule 22b such that the beam expansion section 76 is recessed relative to the distal end (e.g., end face) of the ferrule 22b.

Operation 108 is performed to remove excess adhesive from the distal end of the ferrule 22b and the optical fiber structure 24b (e.g., via wiping).

Figure 14:
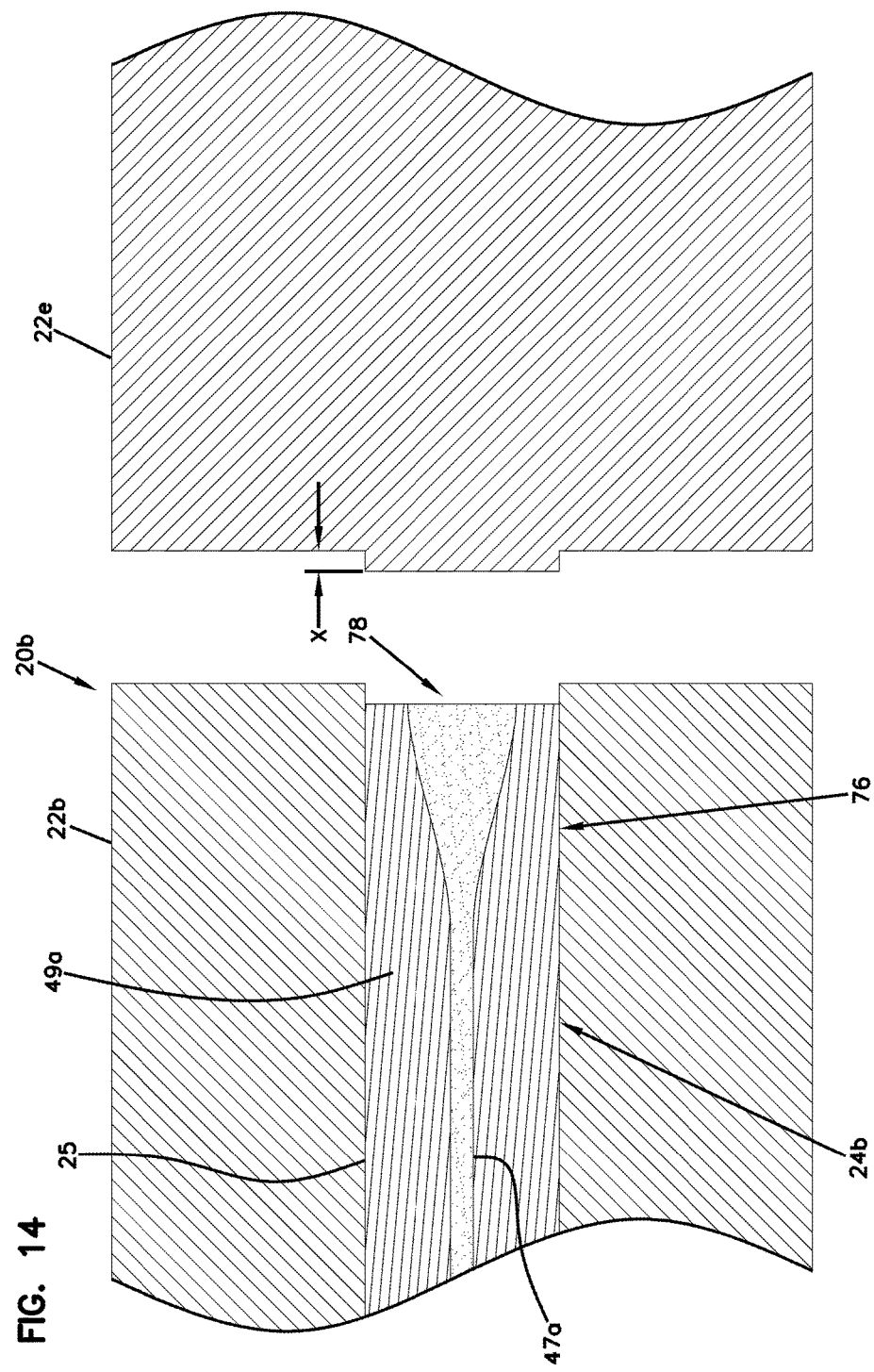
FIG. 14 is a schematic view of the ferrule shown in FIG. 13 mated with a reference ferrule for setting a desired recess distance in accordance with the principles of the present disclosure.

After operation 108 has been completed, operation 110 is performed to move (e.g., distally push) the optical fiber structure 24b distally relative to the ferrule 22b to establish a position of the optical fiber structure 24b such that the beam expansion section 76 is protruding from the distal end 62 of the ferrule 22b. In other examples, the end face 78 of the beam expansion section 76 can be positioned flush with the distal end of the ferrule 22a. Operation 112 follows operation 110. At operation 112, the ferrule 22b can be mated with a reference ferrule 22e (see FIG. 14) having a reference fiber that is used as a mechanical stop for setting a desired recess distance of the end face 78 of the beam expansion section 76 relative to the distal end of the ferrule 22b. The reference fiber protrudes a distance "x" beyond corresponding ferrule end face of the reference ferrule 22e. When the ferrule assembly 20b is mated with the reference ferrule 22e, the reference fiber extends into the fiber opening 66b of the ferrule 22b thereby displacing the optical fiber structure 24b back into the ferrule 22b by the distance "x". Thus, the distance "x" corresponds to a desired recess distance of the end face 78 of the beam expansion section 76 relative to the distal end face of the ferrule 22b. Once the recess location of the end face 78 has been established, the reference ferrule 22e is de-mated from the ferrule 22b. The reference ferrule 22e and the protruding fiber may be covered with a material that does not adhere to the adhesive. In other examples, the ferrule with the protruding fiber may be a disposable (i.e., consumable) part of the manufacturing process.

Operation 114 follows operation 112. Operation 114 is performed to cure the adhesive to fix the optical fiber structure 24b within the fiber opening 66b such that the end face 78 of the beam expansion section 76 is axially fixed at the desired recess location relative to the distal end of the ferrule 22b. Operation 116 follows operation 114. Operation 116 is performed to remove excess adhesive 70 from the pre-processed end face 78 of the optical fiber structure 24b using a non-contact energy source. In certain examples, the energy source does not remove the pre-applied anti-reflective coating from the end face 78. In other examples, the anti-reflective coating is applied to the end face 78 of the optical fiber structure 24b after the adhesive has been removed from the end face by the non-contact energy source. In other examples, the non-contact energy source may be used to remove excess adhesive from the ferrule 22b.

Typically in a ferrule, the fiber core is rarely perfectly centered within the ferrule due to manufacturing tolerances. The offset distance between the center of the fiber core and the center of the ferrule is the core offset. To optically connect two connectors, they are inserted into an adapter having an alignment sleeve that receives and co-axially aligns the ferrules. Ideally, the cores of the fibers are co-axially aligned so that light can be transmitted between the fibers. However, due to core offset, the cores may not be co-axially aligned. For example, a worse-case scenario is when the core offsets of connected ferrules are 180 degrees offset from one another.

In certain connectors, the connectors are "tuned" by identifying the direction of core offset, and then assembling the connectors so that the core offsets are always facing in the same direction (e.g., the twelve o'clock position). In this way, when two connectors are mated, the core offsets are aligned and the worse-case scenario of the core offsets being 180 degrees offset from one another will not occur. In an APC connector, the core offset is taken into consideration so that the direction of the core offset is oriented at a predetermined position relative to the direction of the angle polish to provide a tuning function.

Figure 16:
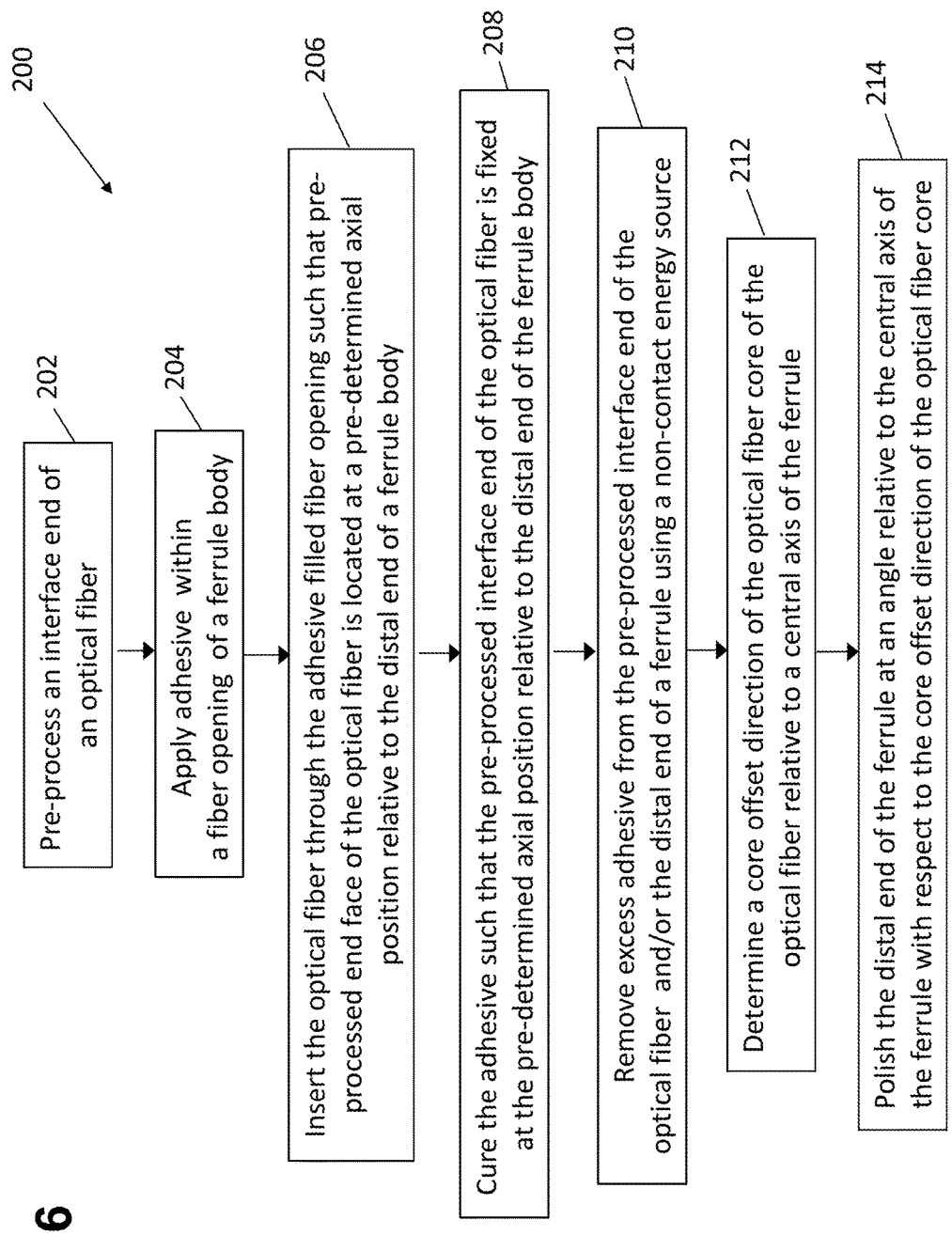
FIG. 16 is a flow chart illustrating another method for processing a distal end face of the optical fiber and a distal end of the ferrule along a plane angled relative to a central axis of the optical fiber.

Referring to FIG. 16, a flow chart is illustrated showing a process 200 for manufacturing a ferrule assembly 20c including a ferrule 22c having an angled distal end face 62c. In one example, the end face 62c is angled 4-12 degrees relative to a central axis of the ferrule 22c. In one example, the ferrule 22c defines a central passage opening 66c (i.e., a fiber passage) that extends axially through the ferrule 22c from a proximal end 64c to the distal end face 62c of the ferrule 22c. The ferrule assembly 20c also includes an optical fiber 24c secured within the fiber passage 66c. The optical fiber 24c includes an interface end 32c positioned at the distal end face 62c.

A first step 202 of the process 200 is an optional a pre-processing step in which the interface end 32c of the optical fiber 24c is processed. For example, the end of the optical fiber 32c can be cleaved (e.g., laser cleaved) and processed using a non-contact energy source to provide a desired geometric shaping and/or to remove imperfections. In a second step 204 of the process 200, adhesive is filled (e.g., injected) in the fiber opening 66c defined by the ferrule 22c. In a third step 206 of the process 200, the optical fiber 24c is inserted with the pre-processed end face through the adhesive filled opening 66c of the ferrule 22c. The optical fiber 24c can be positioned within the fiber opening 66c such that the pre-processed end 32c of the optical fiber 24c is located at a pre-determined axial position relative to the distal end 62c of the ferrule 22c. In a fourth step 208 of the process 200, the adhesive is cured to fix the optical fiber 24c within the fiber opening 66c such that the pre-processed end 32c of the optical fiber 24c is fixed at the pre-determined axial position relative to the distal end 62c of the ferrule 22c. In a fifth step 210 of the process 200, residual cured adhesive is removed from the interface end 32c of the optical fiber 24c and/or the end 62 of the ferrule 22c using a non-contact energy source of the type previously described (e.g., plasma discharge, laser or other energy source previously described). In a sixth step 212 of the process 200, a core offset direction of the optical fiber core of the optical fiber 24c is determined relative to a central axis of the ferrule 22c. The core offset direction can be determined visually without interference from residual adhesive singe the adhesive has already been removed using the non-contact energy source. In a seventh step 214, the distal end 62c of the ferrule 22c is polished at an angle (e.g., about 8 degrees) relative to the central axis of the ferrule 22c with an orientation of the angle being determined with respect to the core offset direction of the optical fiber core determined in the previous step.

Figure 17:
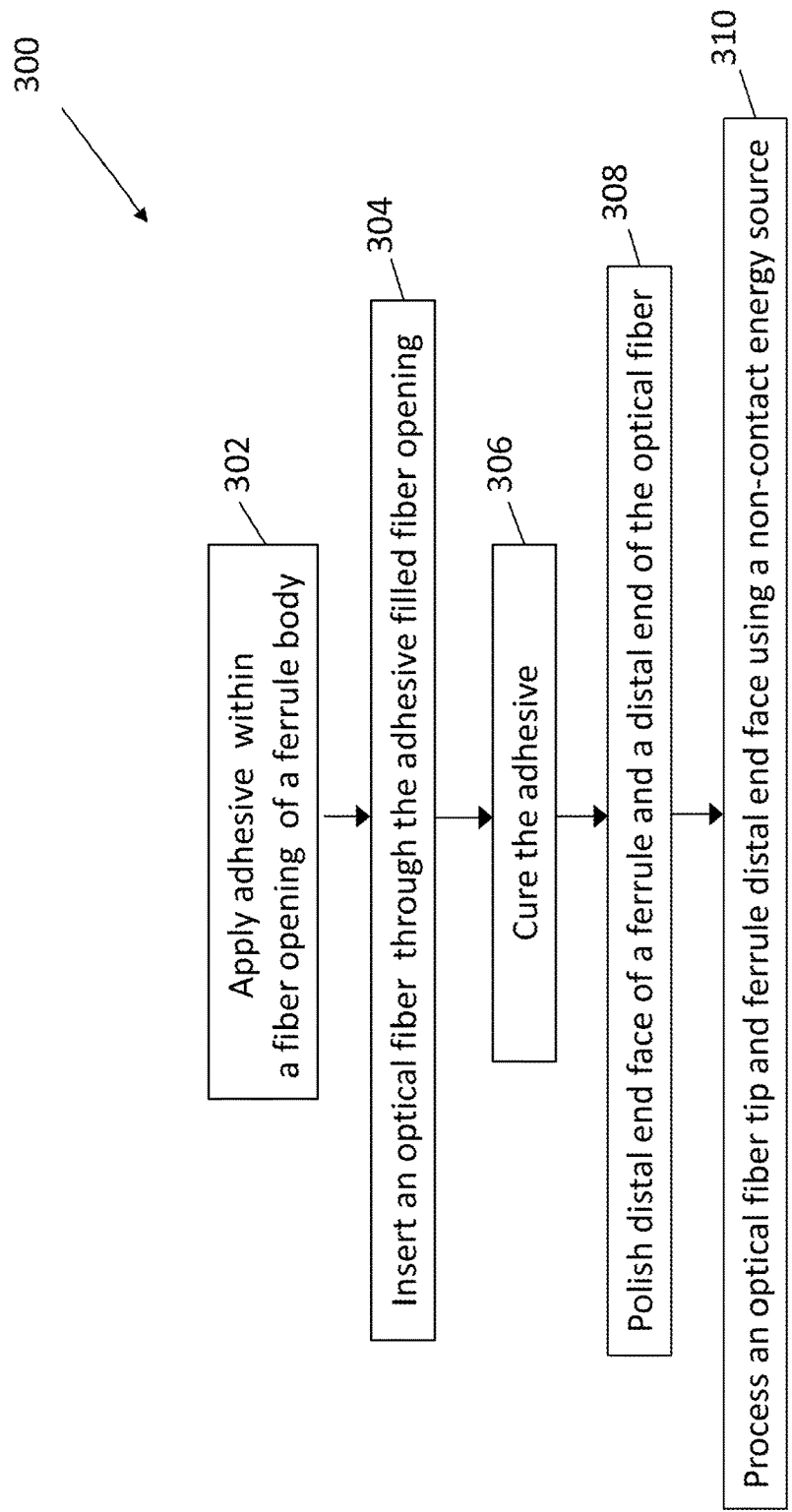
FIG. 17 is a flow chart illustrating a method for establishing an end face geometry for an optical fiber and/or a cylindrical ferrule supporting the optical fiber in accordance with the principles of the present disclosure.

FIG. 17 outlines a process 300 in accordance with the principles of the present disclosure for establishing an end face geometry for an optical fiber and/or a cylindrical ferrule supporting the optical fiber. The ferrule can define a central fiber opening that extends axially through the ferrule from a proximal end to a distal end face of the ferrule. The optical fiber includes an interface end positioned at the distal end face of the ferrule. In a first step 302 of the process 300, the fiber opening defined by the ferrule is filled with adhesive (e.g., by an injection process). In a second step 304 of the process 300, the optical fiber is inserted with through the adhesive filled opening of the ferrule. The optical fiber can be positioned within the fiber opening such that the interface end the optical fiber is located at a pre-determined axial position relative to the distal end of the ferrule. Alternatively, the interface end of the fiber need not be precisely positioned relative to the ferrule and can be positioned generally to protrude from the ferrule end face. In one example, the optical fiber end can be cleaved to a desired protrusion length at a later step (e.g., after adhesive curing). In a third step 306 of the process 300, the adhesive is cured. In a fourth step 308 of the process 300, the distal end face of the ferrule and the distal end of the optical fiber are polished using one or more abrasive mechanical polishing steps. The mechanical polishing steps can provide shaping of the fiber and/or the ferrule, can provide imperfection removal of the fiber distal end face and can assist in establishing a desired relative axial position between the fiber tip and the ferrule end face (e.g., a desired fiber tip protrusion length, a desired fiber tip recession depth, or a flush configuration). A fifth step 310 after the fourth step 308 of the process 300 includes using a non-contact energy source (e.g., plasma discharge, laser or other energy source previously described) to further process (e.g., finally process) the optical fiber tip and/or the ferrule end face. For example, the non-contact energy source can be used to shape the fiber tip, re-flow the surface of the fiber tip or clean the surface of the fiber tip. Shaping the fiber tip can include modifying the fiber tip to include at least some curvature (e.g., shaping to a desired fiber radius). In certain examples, the fiber tip and the ferrule end are modified in shape so as to comply with industry standards or parameters for end face geometry. In certain examples, the fiber tip can be provided with at a least portion having a spherical shape of a desired radius. In certain examples, re-flowing the surface of the fiber tip can assist in reducing loss-inducing imperfections in the surface. In certain examples, cleaning can include removing contaminants (e.g., dust or other particles) from the fiber tip surface. In certain example, the ferrule can also be shaped to a desired radius using the non-contact energy source.

FIG. 18 outlines a process 400 in accordance with the principles of the present disclosure for establishing end face geometries for optical fibers 24d and/or a generally rectangular multi-fiber ferrule 22d supporting the optical fibers 24d. A ferrule assembly 20d including the multi-fiber ferrule 22d supporting the optical fibers 24d is shown at FIGS. 19-21. The multi-fiber ferule 22d includes parallel fiber openings 66d for receiving the optical fibers 24d. The multi-fiber ferrule 22d further includes alignment openings 67 that are parallel to the fiber openings 66d. In a male version of the multi-fiber ferrule 22d, alignment pins are mounted in the alignment openings 67. In a female version of the multi-fiber ferrule, the alignment openings 67 remain open so as to be configured to receive the alignment pins of a mating male multi-fiber ferrule when the male and female multi-fiber ferrules are coupled together.

In a first step 402 of the process 400, the fiber openings 66d defined by the ferrule 22d are filled with adhesive (e.g., by an injection process). In a second step 404 of the process 400, the optical fibers 24d are inserted with through the adhesive filled openings 66d of the ferrule 22d. The optical fibers 24d can be positioned within the fiber opening 66d such that the ends the optical fibers 24d are located at a pre-determined axial position relative to the distal end of the multi-fiber ferrule 22d. In a third step 406 of the process 400, the adhesive is cured. In a fourth step 408 of the process 400, residual adhesive at the distal ends of the optical fibers 24d and/or at the distal end of the multi-fiber ferrule 22d can be removed using a mechanical polishing process or using a non-contact energy source (e.g., a plasma discharge).

In a fifth step 508 of the process 500 which occurs after the fourth step 506, a desired fiber protrusion length is established for the optical fibers 24d from the distal end face of the multi-fiber ferrule 24d. In one example, the protrusion length is established by ablating away the distal end face of the ferrule 22d with a laser without ablating the optical fibers 24d. The laser can also be used to shape the ferrule and/or provide structural features (e.g., steps, recesses, etc.) at the distal end of the multi-fiber ferrule 22d. In certain examples, pulsed fiber laser devices can be used to generate the laser beams for use in ablating the outer layers of the distal end of a ferrule without ablating the optical fibers. An example series of laser devices suitable for micro-machining ferrules in the manner described above include the G3 RM/HS series 10-20 W pulsed fiber lasers which are sold by SPI Lasers UK Ltd, of South Hampton, UK.

As described above, the lasers used in ablating the distal surfaces of ferrules in accordance with the present disclosure preferably have laser beam characteristics selected to allow the laser beams to ablate the material of the ferrule 22d without substantially ablating the optical fibers 24d potted within the ferrule 22d. An example patent showing a multi-fiber ferrule having a distal end face with peripheral portions of the end face recessed relative to a central portion of the end face is shown in United States Patent Application Publication No. US2005/0180702, which is hereby incorporated by reference in its entirety. While the examples described above use a laser in a micro-machining process to remove portions of the ferrule, it will be understood that other micro-machining techniques for removing/ablating the end material of a ferrule can be used as well. For example, micro-mechanical machining techniques using micro or nano-mechanical machining tools (e.g., micro or nano mechanical cutting tools, latches, etc.) can be used to remove portions of the ferrule end face to expose desired fiber protrusion lengths. Micro or nano robotics may be used to implement such micro-mechanical machining techniques. Also, micro-machining techniques can use etching techniques such as chemical or plasma etching. Other types of plasma based removal techniques can also be used. Moreover, ablation tools using electromagnetic wave-based energy streams (e.g., pulsed, continuous) other than laser light can also be used.

In a sixth step 510 that occurs after the fifth step 508, a non-contact energy source (e.g., plasma discharge, laser or other energy source previously described) is used to further process (e.g., finally process) the distal tips of the optical fibers 24d and/or the distal end face of the ferrule 22d. For example, the non-contact energy source can be used to shape the fiber tips, re-flow the surface of the fiber tips or clean the surfaces of the fiber tips. Shaping the fiber tips can include modifying the fiber tips to include at least some curvature (e.g., shaping to a desired fiber radius). In certain examples, the fiber tips and the ferrule end are modified in shape so as to comply with industry standards or parameters for end face geometry. In certain examples, the fiber tips can be provided with at a least portion having a spherical shape of a desired radius. In certain examples, re-flowing the surface of the fiber tips can assist in reducing loss-inducing imperfections in the surface. In certain examples, cleaning can include removing contaminants (e.g., dust or other particles) from the fiber tip surface. In certain example, portions of the ferrule 22d can also be shaped to a desired radius using the non-contact energy source.

From the forgoing detailed description, it will be evident that modifications and variations can be made without departing from the spirit and scope of the disclosure.

The invention claimed is:

1. A method for processing an optical fiber and for securing the optical fiber to a ferrule, the ferrule including a ferrule body having a distal end and a proximal end, the ferrule body also defining a fiber opening that extends axially through the ferrule body from the proximal end to the distal end, the method comprising:
- (a) processing a distal end face of the optical fiber so as to round and shape the distal end face of the optical fiber to form a pre-processed end face of the optical fiber;
- (b) applying adhesive within the fiber opening of the ferrule body;
- (c) inserting the optical fiber with the pre-processed end face through the adhesive filled opening of the ferrule body and positioning the optical fiber within the fiber opening such that the pre-processed end face of the optical fiber is located at a pre-determined axial position relative to the distal end of the ferrule body;
- (d) curing the adhesive to fix the optical fiber within the fiber opening such that the pre-processed end face of the optical fiber is fixed at the pre-determined axial position relative to the distal end of the ferrule body; and
- (e) removing excess adhesive from the pre-processed end face of the optical fiber using a non-contact energy source.

2. The method of claim 1, further comprising the step of:
- (a) polishing the pre-processed end face of the optical fiber after the adhesive has been removed.

3. The method of claim 1, wherein:
- (a) the step of processing the distal end face of the optical fiber includes a laser ablation process.

4. The method of claim 1, wherein:
- (a) the step of processing the distal end face of the optical fiber includes a plasma process.

5. The method of claim 1, wherein:
- (a) the optical fiber includes a GRIN fiber fused to an end of the optical fiber secured within the ferrule.

6. The method of claim 1, further comprising the step of:
- (a) determining a core offset of the optical fiber.

7. The method of claim 6, further comprising the step of:
- (a) polishing an end face of the ferrule to achieve a pre-selected angle relative to the core offset of the optical fiber.

8. The method of claim 7, wherein:
- (a) the pre-selected angle ranges from about 6 to about 10 degrees.

9. The method of claim 1, wherein:
- (a) a flat plate is used as a stop arrangement to set the pre-determined axial position.

10. The method of claim 9, wherein:
- (a) the flat plate defines an opening for allowing the excess adhesive to pass therethrough.

11. The method of claim 3, wherein:
- (a) the laser ablation process includes a plurality of laser beam pulses that are directed at the distal end face of the optical fiber.

12. The method of claim 11, wherein:
- (a) the laser beam pulses have wavelengths in the range of 200-3000 nanometers.

13. The method of claim 5, further comprising the step of:
- (a) coating an anti-reflective material on the distal end face of the GRIN lens after the adhesive is removed.

14. The method of claim 3, wherein:
- (a) the laser ablation process includes directing a plurality of laser beam pulses at an end face of the ferrule to ablate a layer of ferrule material from the ferrule without ablating the distal end face of the optical fiber, wherein after the layer has been ablated the optical fiber projects distally outwardly from the ferrule a distance equal to a thickness of the ferrule layer removed by the plurality of laser beam pulses.

15. The method of claim 1, wherein:
- (a) the non-contact energy source includes an electromagnetic wave based energy stream to remove the portion of the distal end face.

16. The method of claim 1, wherein:
- (a) the curing comprises directing energy from a $CO_2$ laser onto the ferrule.

17. The method of claim 4, wherein:
- (a) the plasma process includes directing a plurality of energy pulses at an end face of the ferrule to ablate a layer of ferrule material from the ferrule without ablating the optical fiber, wherein after the layer has been ablated the optical fiber projects distally outwardly from the ferrule a distance equal to a thickness of the ferrule layer removed by the plurality of energy pulses.

18. The method of claim 1, wherein:
- (a) the ferrule is an MT-type ferrule.

19. A method for processing an optical fiber and for securing the optical fiber to a ferrule, the ferrule including a ferrule body having a distal end and a proximal end, the ferrule body also defining a fiber opening that extends axially through the ferrule body from the proximal end to the distal end, the method comprising:
- (a) processing a distal end face of the optical fiber so as to round and shape the distal end face of the optical fiber to form a pre-processed end face of the optical fiber;
- (b) applying adhesive within the fiber opening of the ferrule body;
- (c) inserting the optical fiber with the pre-processed end face through the adhesive filled opening of the ferrule body and positioning the optical fiber within the fiber opening such that the pre-processed end face of the optical fiber is located at a pre-determined axial position relative to the distal end of the ferrule body;
- (d) curing the adhesive to fix the optical fiber within the fiber opening such that the pre-processed end face of the optical fiber is fixed at the pre-determined axial position relative to the distal end of the ferrule body;
- (e) removing excess adhesive from the pre-processed end face of the optical fiber using a non-contact energy source;
- (f) determining an initial core offset distance of an optical fiber core; and
- (g) polishing an end face of the ferrule at an 8 degree angle relative to the initial core offset distance of the optical fiber core.

20. A method for processing an optical fiber and for securing the optical fiber to a ferrule, the optical fiber including a beam expansion section, the beam expansion section having a construction adapted to expand an optical beam from a first beam diameter to an enlarged second beam diameter, the ferrule including a ferrule body having a distal end and a proximal end, the ferrule body also defining a fiber opening that extends axially through the ferrule body from the proximal end to the distal end, the method comprising:
- (a) processing a distal end face of the optical fiber to form an optical fiber with a pre-processed end face;
- (b) applying adhesive within the fiber opening of the ferrule body;
- (c) inserting the optical fiber with the pre-processed end face through the adhesive filled opening of the ferrule body and retracting the optical fiber back into the fiber opening of the ferrule such that the beam expansion section is recessed relative to the distal end of the ferrule;
(d) removing excess adhesive from the distal end of the ferrule;
(e) establishing a position of the optical fiber such that the beam expansion section is protruding from the end face of the ferrule;
(f) setting a recess distance of an optical fiber tip relative to the distal end of the ferrule;
(g) curing the adhesive to fix the optical fiber within the fiber opening such that the beam expansion section is fixed relative to the distal end of the ferrule body; and
(h) removing excess adhesive from the pre-processed end face of the optical fiber using a non-contact energy source.

21. The method of claim 20, wherein:
(a) the beam expansion section includes a GRIN fiber.

22. The method of claim 20, further comprising the step of:
(a) mating an optical component having a ferrule that protrudes a pre-determined distance with the fiber optic component such that the beam expansion section is recessed relative to the end face of the ferrule by the pre-determined distance.

23. A method for processing a ferrule assembly, the ferrule assembly including an optical fiber adhesively secured within a fiber opening defined by a ferrule, the method comprising:
(a) at least partially filling the fiber opening of the ferrule with adhesive;
(b) inserting the optical fiber into the fiber opening containing the adhesive;
(c) curing the adhesive to secure the optical fiber within the ferrule; and
(d) removing excess adhesive from a distal end of the optical fiber and/or from a distal end face of the ferrule using a non-contact energy source, wherein the step of removing excess adhesive from a distal end of the optical fiber and/or from a distal end face of the ferrule does not change a position of the distal end of the optical fiber relative to the distal end face of the ferrule.

24. The method of claim 23, wherein:
(a) the non-contact energy source includes a plasma discharge.

25. The method of claim 24, wherein:
(a) the plasma discharge is shaped by one or more air streams directed at the plasma discharge.

26. The method of claim 24, wherein:
(a) a heat sink is used to draw heat away from the distal end of the optical fiber and/or from the distal end face of the ferrule.

27. The method of claim 23, wherein:
(a) the distal end of the optical fiber is pre-processed prior to insertion into the fiber opening of the ferrule.

28. The method of claim 27, wherein:
(a) the distal end of the optical fiber is processed using a non-contact energy source.

29. The method of claim 28, wherein:
(a) the non-contact energy source is used to shape the distal end of the optical fiber to a desired geometry.

30. The method of claim 29, wherein:
(a) the non-contact energy source is used to remove imperfections from the distal end of the optical fiber.

31. The method of claim 27, further comprising:
(a) mechanically polishing the distal end of the optical fiber and/or the distal end face of the ferrule after the adhesive has been removed.

32. The method of claim 27, further comprising:
(a) using a mechanical stop to establish a relative axial position between the distal end of the optical fiber and the distal end face of the ferrule before the adhesive is cured.

33. The method of claim 32, wherein:
(a) the mechanical stop is formed at least in part by a plate.

34. The method of claim 33, wherein:
(a) the plate defines a through-hole for allowing adhesive to pass through the plate.

35. The method of claim 33, wherein:
(a) the plate is made of a material having a composition that includes sapphire.

36. The method of claim 23, further comprising:
(a) mechanically polishing the distal end of the optical fiber and/or the distal end face of the ferrule after the adhesive has been removed.

37. The method of claim 23, further comprising:
(a) determining a core offset direction of the optical fiber after removal of the adhesive; and
(b) polishing the distal end face of the ferrule at an angle relative to a central axis of the ferrule with the orientation of the angle being dependent upon the core offset direction of the optical fiber.

38. The method of claim 23, wherein:
(a) the optical fiber includes a lens.

39. The method of claim 38, wherein:
(a) the lens includes a GRIN lens.

40. The method of claim 39, wherein:
(a) a distal end face of the GRIN lens forms the distal end of the optical fiber and is recessed relative to the distal end face of the ferrule when the adhesive is removed.

* * * * *